(12) United States Patent
Lee et al.

(10) Patent No.: US 12,550,598 B2
(45) Date of Patent: Feb. 10, 2026

(54) MANUFACTURING METHOD OF DISPLAY DEVICE AND DISPLAY DEVICE

(71) Applicant: Samsung Display Co., LTD., Yongin-si (KR)

(72) Inventors: Hong Yeon Lee, Yongin-si (KR); Oh Jeong Kwon, Yongin-si (KR); Seung Yeon Jeong, Yongin-si (KR); Hyeo Ji Kang, Yongin-si (KR); Woo Young Kim, Yongin-si (KR); Tae Ho Kim, Yongin-si (KR); Mi Hwa Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 297 days.

(21) Appl. No.: 18/355,509

(22) Filed: Jul. 20, 2023

(65) Prior Publication Data
US 2024/0215410 A1    Jun. 27, 2024

(30) Foreign Application Priority Data
Dec. 22, 2022   (KR) .................. 10-2022-0182297

(51) Int. Cl.
*H10K 59/80*    (2023.01)
*H10K 59/40*    (2023.01)

(52) U.S. Cl.
CPC ......... *H10K 59/8791* (2023.02); *H10K 59/40* (2023.02)

(58) Field of Classification Search
CPC .... H10K 59/8791; H10K 59/40; H10K 59/12; H10K 59/1201; H10K 59/875; H10K 71/00; H10K 50/858; H10K 50/86; C22B 30/06; C22B 59/00
See application file for complete search history.

(56) References Cited

U.S. PATENT DOCUMENTS

| 2022/0209204 A1 | 6/2022 | Kim et al. |
| 2022/0238848 A1 | 7/2022 | Kwon et al. |

(Continued)

FOREIGN PATENT DOCUMENTS

| KR | 10-2022-0097789 | 7/2022 |
| KR | 10-2022-0108287 | 8/2022 |
| KR | 10-2022-0125903 | 9/2022 |

(Continued)

OTHER PUBLICATIONS

Maksudova et al., "The ytterbium-bismuth system", Journal of the Less Common Metals, Jan. 12, 1985, pp. L19-L23, vol. 109.

(Continued)

*Primary Examiner* — Donald L Raleigh
(74) *Attorney, Agent, or Firm* — Womble Bond Dickinson (US) LLP

(57) ABSTRACT

A manufacturing method of a display device includes forming a light emitting element layer on a substrate, co-depositing bismuth (Bi) and ytterbium (Yb) on the light emitting element layer to form a first inorganic absorbing layer, and forming a reflection control layer on the first inorganic absorbing layer. In the co-depositing, a deposition temperature of bismuth (Bi) is in a range of about 500° C. to about 850° C., a deposition temperature of ytterbium (Yb) is in a range of about 300° C. to about 550° C., and an extinction coefficient of the first inorganic absorbing layer is less than or equal to about 3.

20 Claims, 15 Drawing Sheets

(56) References Cited

U.S. PATENT DOCUMENTS

2022/0285655 A1   9/2022  Lee et al.
2023/0105374 A1   4/2023  Jeong et al.

FOREIGN PATENT DOCUMENTS

| KR | 10-2023-0049815 | 4/2023 |
| KR | 10-2023-0097241 | 7/2023 |

OTHER PUBLICATIONS

Toudert et al., "Optical properties of bismuth nanostructures towards the ultrathin film regime", Optical Materials Express, Jul. 1, 2019, pp. 2924-2936, vol. 9, No. 7.

MANUFACTURING METHOD OF DISPLAY DEVICE AND DISPLAY DEVICE

CROSS-REFERENCE TO RELATED APPLICATION(S)

This application claims priority to and benefits of Korean Patent Application No. 10-2022-0182297 under 35 U.S.C. § 119, filed on Dec. 22, 2022, in the Korean Intellectual Property Office (KIPO), the entire contents of which are incorporated herein by reference.

BACKGROUND

1. Technical Field

The disclosure relates to a manufacturing method of a display device and the display device.

2. Description of the Related Art

Recently, as interest in an information display is increasing research and development for display devices are continuously conducted.

SUMMARY

The disclosure has been made in an effort to provide a display device with high efficiency by reducing reflectance and improving transmittance.

Embodiments of the disclosure is not limited to the embodiment mentioned below, and other technical objects that are not mentioned may be clearly understood to a person of an ordinary skilled in the art using the following description.

According to an embodiment, a manufacturing method of a display device may include forming a light emitting element layer on a substrate, co-depositing bismuth (Bi) and ytterbium (Yb) on the light emitting element layer to form a first inorganic absorbing layer, and forming a reflection control layer on the first inorganic absorbing layer. In the co-depositing, a deposition temperature of bismuth (Bi) may be in a range of about 500° C. to about 850° C., a deposition temperature of ytterbium (Yb) may be in a range of about 300° C. to about 550° C., and an extinction coefficient of the first inorganic absorbing layer may be less than or equal to about 3.

In the co-depositing, a bismuth (Bi) metal compound and an ytterbium (Yb) metal compound may be simultaneously thermally deposited.

In the co-depositing, a bismuth (Bi) inorganic compound and an ytterbium (Yb) inorganic compound may be simultaneously thermally deposited.

In the co-depositing, the deposition temperature of bismuth (Bi) may be in a range of about 600° C. to about 700° C., and the deposition temperature of ytterbium (Yb) may be in a range of about 480° C. to about 540° C.

A composition ratio of bismuth (Bi) and ytterbium (Yb) in the first inorganic absorbing layer may be in a range of about 80:20 to about 40:60.

A refractive index of the first inorganic absorbing layer may be in a range of about 1 to about 3.

The first inorganic absorbing layer may further include at least one of titanium (Ti), zirconium (Zr), tungsten (W), tantalum (Ta), and molybdenum oxide ($MoO_3$).

The manufacturing method of the display device may further include forming a second inorganic absorbing layer on the first inorganic absorbing layer.

The second inorganic absorbing layer may be directly formed on the first inorganic absorbing layer.

The second inorganic absorbing layer may include at least one of bismuth (Bi), ytterbium (Yb), titanium (Ti), zirconium (Zr), tungsten (W), tantalum (Ta), and molybdenum oxide ($MoO_3$).

The manufacturing method of the display device may further include forming a light blocking layer on the first inorganic absorbing layer. The reflection control layer may be formed on the light blocking layer.

According to an embodiment, a display device may include a light emitting element layer, a first inorganic absorbing layer disposed on the light emitting element layer and including a multi-element co-deposited film, and a reflection control layer disposed on the first inorganic absorbing layer. An extinction coefficient of the first inorganic absorbing layer may be less than or equal to about 3.

The display device may further include a second inorganic absorbing layer disposed between the first inorganic absorbing layer and the reflection control layer.

The first inorganic absorbing layer and the second inorganic absorbing layer may include a same material.

Each of the first inorganic absorbing layer and the second inorganic absorbing layer may include at least one of bismuth (Bi), ytterbium (Yb), titanium (Ti), zirconium (Zr), tungsten (W), tantalum (Ta), and molybdenum oxide ($MoO_3$).

The first inorganic absorbing layer may include bismuth (Bi) and ytterbium (Yb).

The second inorganic absorbing layer may include bismuth (Bi) or ytterbium (Yb).

A composition ratio of bismuth (Bi) and ytterbium (Yb) in the first inorganic absorbing layer may be in a range of about 80:20 to about 40:60.

A refractive index of the first inorganic absorbing layer may be in a range of about 1 to about 3.

The display device may further include a light blocking layer disposed between the first inorganic absorbing layer and the reflection control layer.

Particularities of other embodiments are included in the detailed description and drawings.

According to the embodiment described above, by co-depositing bismuth (Bi) and ytterbium (Yb) to form an inorganic absorbing layer, an extinction coefficient of the inorganic absorbing layer may be reduced, so that it is possible to improve efficiency and to minimize oxidation.

Effects of embodiments of the disclosure are not limited by what is illustrated in the above, and more various effects are included in the specification.

DETAILED DESCRIPTION OF THE EMBODIMENTS

Figure 1:
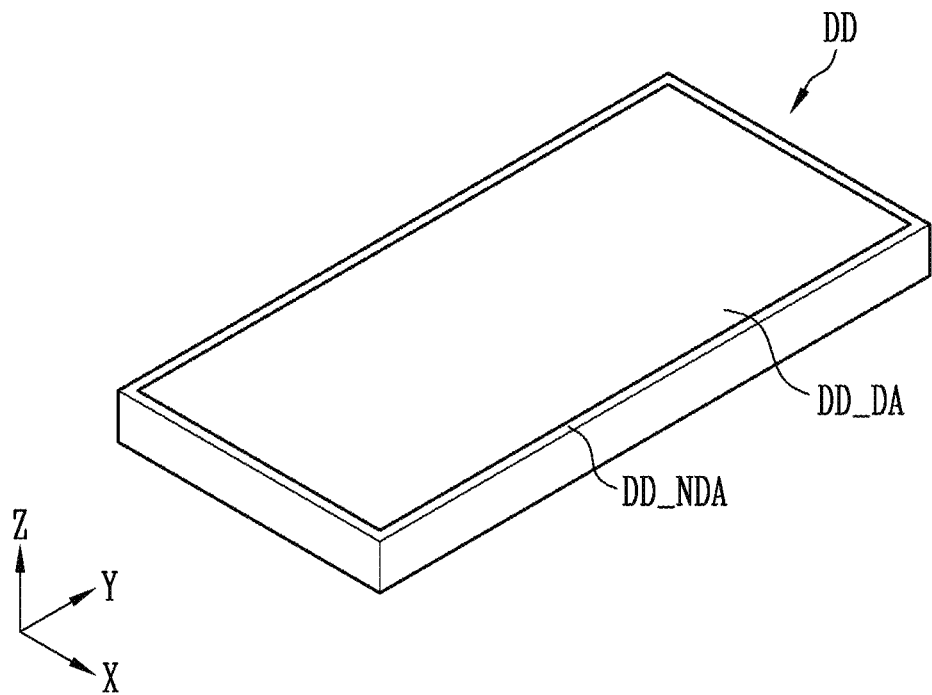
FIG. 1 illustrates a perspective view of a display device according to an embodiment.

Advantages and features of the disclosure and methods of accomplishing the same may be understood more readily by reference to the following detailed description of embodiments and the accompanying drawings. The disclosure may, however, be embodied in different forms and should not be construed as limited to the embodiments set forth herein. The embodiments are provided so that this disclosure will be more thorough and complete, and will fully convey the scope of the disclosure to those skilled in the art, and further, the disclosure is only defined by scopes of claims.

The terms used herein are for the purpose of describing particular embodiments only and is not intended to be limiting. As used herein, the singular forms "a", "an" and "the" are intended to include the plural forms as well, unless the context clearly indicates otherwise. It will be further understood that the terms "comprise" and/or "comprising", "include" or "including", and "have" or "having", when used in the disclosure, specify the presence of stated elements, steps, operations, and/or devices, but do not preclude the presence or addition of one or more other elements, steps, operations, and/or devices.

It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

The term "connection" or "coupling" may comprehensively mean a physical and/or electrical connection or coupling. This may comprehensively mean a direct or indirect connection or coupling, and an integrated or non-integrated connection or coupling.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Throughout the specification, the same reference numerals denote the same constituent elements.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the disclosure.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in detail with reference to the accompanying drawings.

Figure 2:
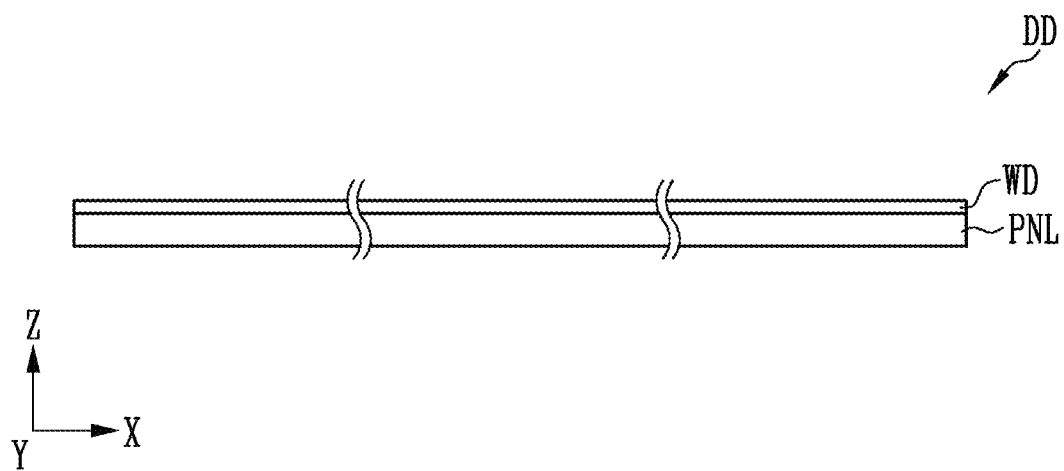
FIG. 2 illustrates a schematic cross-sectional view of a display device according to an embodiment.
Figure 3:
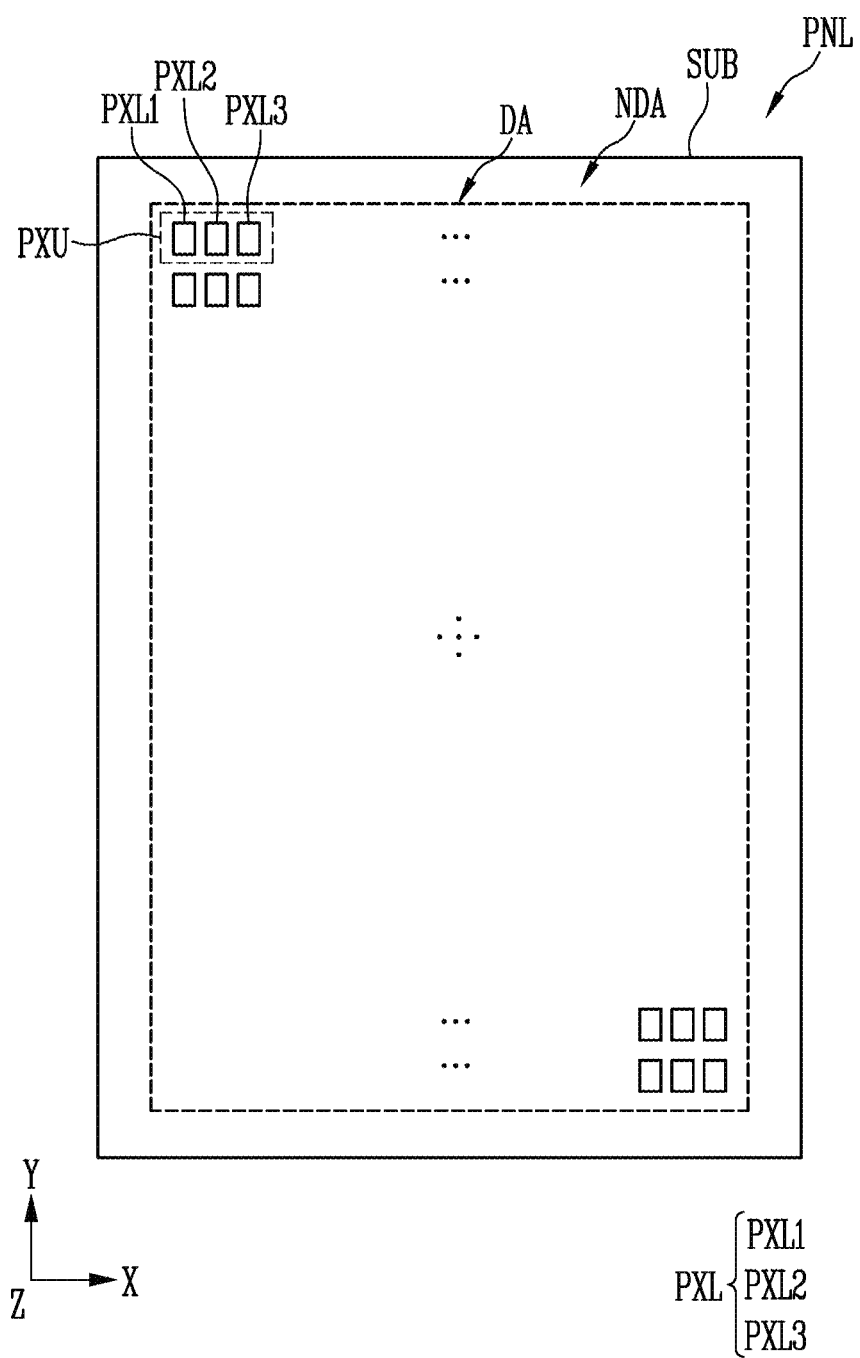
FIG. 3 illustrates a top plan view of a display panel according to an embodiment.

FIG. 1 illustrates a perspective view of a display device according to an embodiment. FIG. 2 illustrates a schematic cross-sectional view of a display device according to an embodiment. FIG. 3 illustrates a top plan view of a display panel according to an embodiment.

Referring to FIG. 1 to FIG. 3, a display device DD may include a display panel PNL and a window WD.

The display device DD may include a display area DD_DA that displays an image and a non-display area DD_NDA that does not display an image. The non-display area DD_NDA may be provided on at least one side of the display area DD_DA. For example, the non-display area DD_NDA may be provided to surround the display area DD_DA.

The display device DD may be provided to have a rectangular shape having angled corners in a plan view, but the disclosure is not limited thereto. In another embodiment, the corners of the display device DD may have a curved shape in a plan view. However, it is not necessarily limited thereto, and the display device DD may be implemented in various shapes.

The display device DD may be applied to an electronic device in which a display surface is applied to at least one surface thereof such as a smart phone, a television, a tablet PC, a mobile phone, a video phone, an electronic book reader, a desktop PC, a laptop PC, a netbook computer, a workstation, a server, a PDA, a portable multimedia player (PMP), an MP3 player, a medical device, a camera, or a wearable display device.

The display panel PNL and a substrate SUB for forming the display panel may include a display area DA for displaying an image and a non-display area NDA other than the display area DA. The display area DA may configure a screen on which an image is displayed, and the non-display area NDA may be the remaining area other than the display area DA.

For better understanding and ease of description, FIG. 3 briefly illustrates a structure of the display panel PNL based on a display area DA. In embodiments, at least one driving circuit part (for example, at least one of a scan driver and a data driver), wires, and/or pads may be further disposed in the display panel PNL.

A pixel unit PXU may be disposed in the display area DA. The pixel unit PXU may include a first pixel PXL1, a second pixel PXL2, and/or a third pixel PXL3. Hereinafter, when arbitrarily referring to at least one of the first pixel PXL1, the second pixel PXL2, and the third pixel PXL3, or when comprehensively referring to two or more types of pixels thereof, they will be referred to as a "pixel PXL" or "pixels PXL".

The pixels PXL may be regularly arranged in a stripe or PENTILE™ pattern. However, the arrangement of the pixels PXL is not limited thereto, and the pixels PXL may be arranged in the display area DA in various structures and/or methods.

In embodiments, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one of the first to third pixels PXL1, PXL2, and PXL3 disposed adjacent to each other may form one pixel unit PXU that emits light of various colors. For example, the first pixel PXL1 may be a red pixel that emits red light, the second pixel PXL2 may be a green pixel that emits green light, and the third pixel PXL3 may be a blue pixel that emits blue light, but the disclosure is not limited thereto. FIG. 3 illustrates an embodiment in which the pixel unit PXU includes one first pixel PXL1, one second pixel PXL2, and one third pixel PXL3, but the disclosure is not necessarily limited thereto. For example, the pixel unit PXU may include one first pixel PXL1, two second pixels PXL2, and one third pixel PXL3.

The first pixel PXL1, the second pixel PXL2, and the third pixel PXL3 may include a first light emitting element (LD1 in FIG. 4), a second light emitting element (LD2 in FIG. 4), and a third light emitting element (LD3 in FIG. 4) as light sources, respectively, that emits light of the first color, light of the second color, and light of the third color, respectively. However, the disclosure is not limited thereto, and the color of light emitted by each pixel PXL may be variously changed.

The window WD for protecting an exposed surface of the display panel PNL may be provided on the display panel PNL. The window WD may protect the display panel PNL from external impact, and may provide an input surface and/or a display surface to a user. The window WD may be combined with the display panel PNL by using an optically clear adhesive member (not shown).

The window WD may have a multi-layered structure and may be a glass substrate, a plastic film, and a plastic substrate. Such a multi-layered structure may be formed through a continuous process or an adhesive process using an adhesive layer. The window WD may be entirely or partially flexible.

Figure 4:
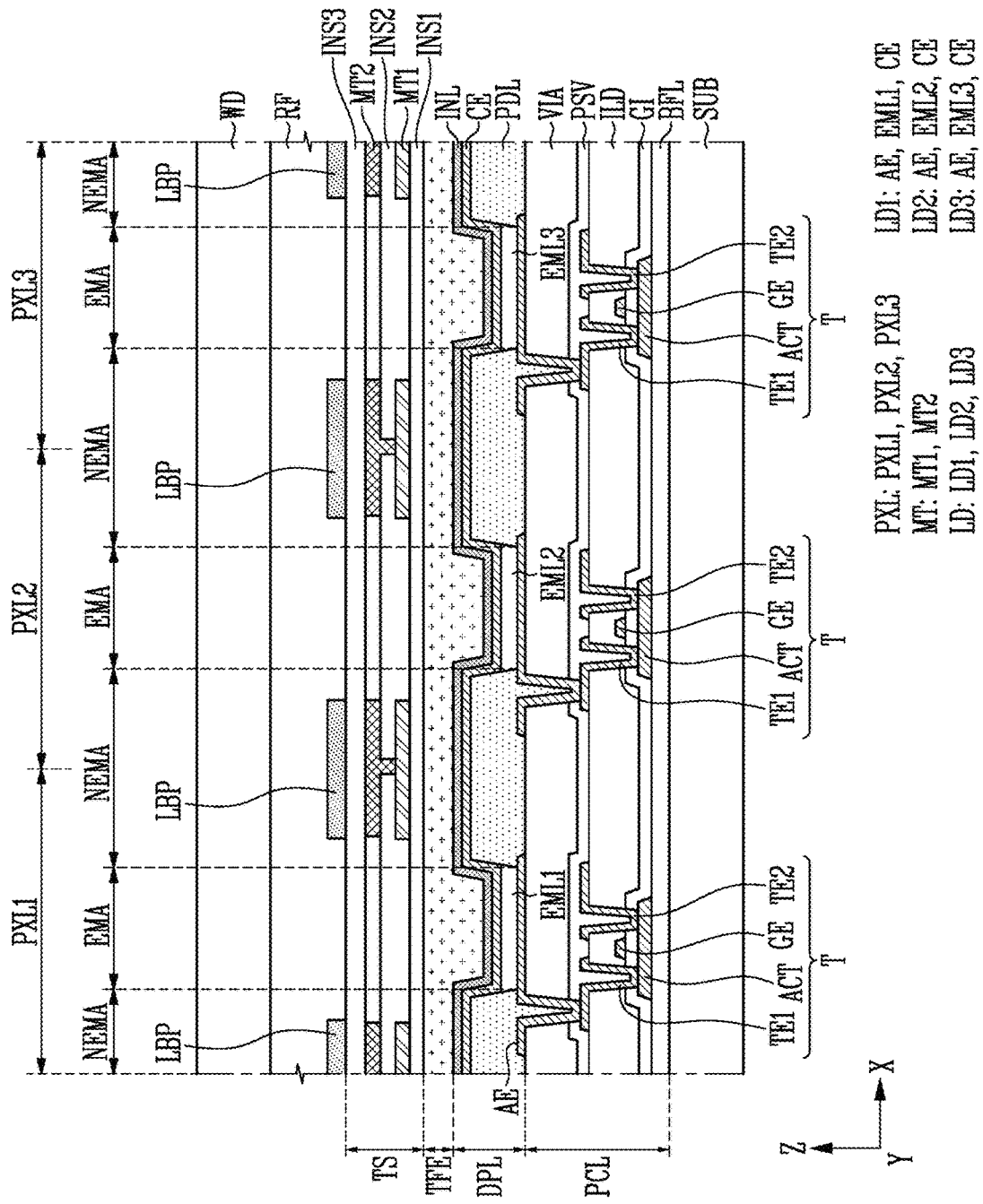
FIG. 4 illustrates a schematic cross-sectional view of a display panel according to an embodiment.
Figure 5:
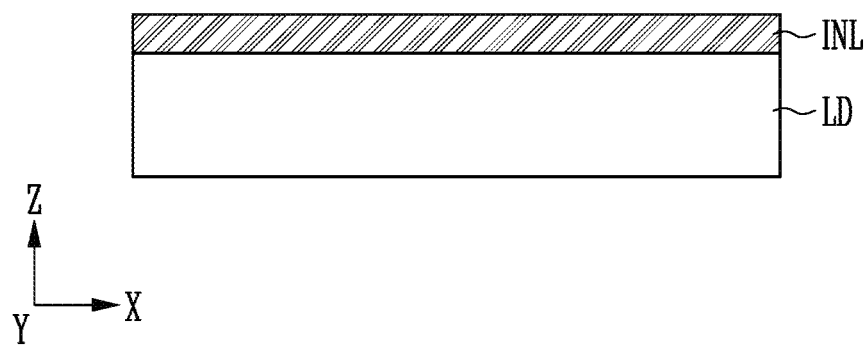
FIG. 5 illustrates a schematic cross-sectional views of an inorganic absorbing layer of FIG. 4 according to an embodiment.
Figure 6:
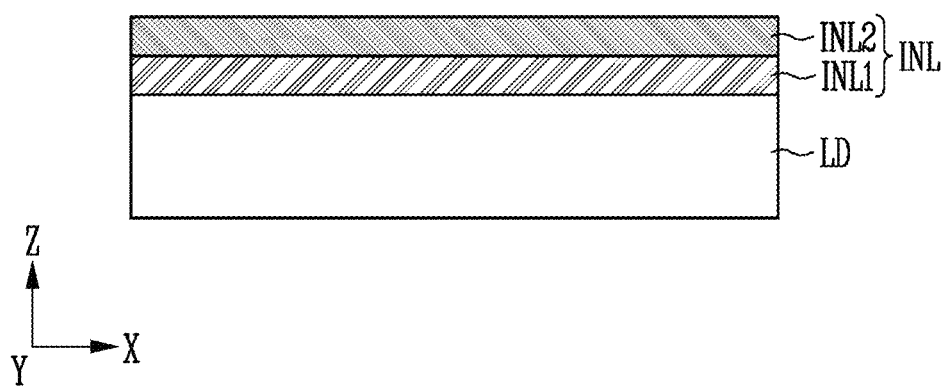
FIG. 6 illustrates a schematic cross-sectional views of an inorganic absorbing layer of FIG. 4 according to an embodiment.

FIG. 4 illustrates a schematic cross-sectional view of a display panel according to an embodiment. FIG. 5 and FIG. 6 illustrate schematic cross-sectional views of an inorganic absorbing layer of FIG. 4.

Referring to FIG. 4, the first to third pixels PXL1, PXL2, and PXL3 may each include a light emitting area EMA, and a non-light emitting area NEMA may be disposed between the light emitting area EMA of each of the first to third pixels PXL1, PXL2, and PXL3.

The first to third pixels PXL1, PXL2, and PXL3 may each include a pixel circuit layer PCL, a display element layer DPL, and a thin film encapsulation layer TFE sequentially disposed on a substrate SUB.

The substrate SUB may form a base surface. The substrate SUB may include a transparent insulating material to transmit light. The substrate SUB may be a rigid substrate or a flexible substrate. For example, the rigid substrate may be one of a glass substrate, a quartz substrate, a glass ceramic substrate, and a crystalline glass substrate. The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate, but the disclosure is not necessarily limited thereto.

The pixel circuit layer PCL may include a pixel circuit provided on the substrate SUB. The pixel circuit layer PCL may include a sensor circuit provided on the substrate SUB.

The pixel circuit layer PCL may include a buffer layer BFL, a gate insulating layer GI, an interlayer insulating layer ILD, a passivation layer PSV, and a via layer VIA that are sequentially stacked on the substrate SUB in a third direction (a Z-axis direction).

The buffer layer BFL may be an inorganic insulating film including an inorganic material. The buffer layer BFL may include at least one of a silicon nitride ($SiN_x$), a silicon oxide ($SiO_x$), a silicon oxynitride ($SiO_xN_y$), and a metal oxide such as an aluminum oxide ($AlO_x$). The buffer layer BFL may be provide as a single layer or a multilayer of at least double layers. In case that the buffer layer BFL is provided as multiple layers, the multiple layers may be made of a same material or different materials. The buffer layer BFL may be omitted depending on the material, a process condition, and the like of the substrate SUB.

A transistor T may be disposed on the buffer layer BFL. The transistor T may include an active pattern ACT, a gate electrode GE, a first transistor electrode TE1, and a second transistor electrode TE2.

The active pattern ACT may be disposed on the buffer layer BFL. The active pattern ACT may include a polysilicon semiconductor. For example, the active pattern ACT may be formed through a low temperature polysilicon process. However, the disclosure is not necessarily limited thereto, and the active pattern ACT may be formed of an oxide semiconductor, a metal oxide semiconductor, or the like.

Each active pattern ACT may include a channel area, a first contact area connected to an end of the channel area, and a second contact area connected to another end of the channel area. The channel area, the first contact area, and the second contact area may be formed of a semiconductor layer in which an impurity is not doped or an impurity is doped. For example, the first contact area and the second contact area may be formed of a semiconductor layer doped with an impurity, and the channel area may be formed of a semiconductor layer that is not doped with an impurity. As the impurity, for example, a p-type impurity may be used, but the disclosure is not limited thereto. One of the first and second contact areas may be a source area, and another of the first and second contact areas may be a drain area.

The gate insulating layer GI may be disposed on the active pattern ACT. The gate insulating layer GI may be an inorganic film (or an inorganic insulating film) including an inorganic material. For example, the gate insulating layer GI may include at least one of a silicon nitride ($SiN_x$), a silicon oxide ($SiO_x$), a silicon oxynitride ($SiO_xN_y$), and a metal oxide such as an aluminum oxide ($AlO_x$). However, the material of the gate insulating layer GI is not limited to the above-described embodiment. In embodiments, the gate insulating layer GI may be formed as an organic film (or organic insulating film) including an organic material. The gate insulating layer GI may be provided as a single layer or a multilayer of at least double layers.

The gate electrode GE may be disposed on the gate insulating layer GI. The gate electrode GE may overlap a channel area of the active pattern ACT in a plan view. The gate electrode GE may be formed of a single-layered structure including at least one of copper (Cu), molybdenum (Mo), tungsten (W), aluminum neodymium (AlNd), titanium (Ti), aluminum (Al), silver (Ag), the like, and an alloy thereof, or in order to reduce wire resistance, the gate electrode GE may be formed of a double-layered or multi-layered structure, each layers including at least one of molybdenum (Mo), titanium (Ti), copper (Cu), aluminum (Al), silver (Ag), and the like, which are a low-resistance material.

The interlayer insulating layer ILD may be disposed on the gate electrode GE. In an embodiment, the interlayer insulating layer ILD and the gate insulating layer GI may include a same material. In an embodiment the interlayer insulating layer ILD may include a material illustrated as constituent materials of the gate insulating layer GI.

The first transistor electrode TE1 and the second transistor electrode TE2 may be disposed on the interlayer insulating layer ILD.

The first transistor electrode TE1 of the transistor T may contact the first contact area of the active pattern ACT through a contact hole penetrating the interlayer insulating layer ILD and the gate insulating layer GI. In case that the first contact area is a source area, the first transistor electrode TE1 may be a first source electrode.

The second transistor electrode TE2 of the transistor T may contact the second contact area of the active pattern ACT through a contact hole penetrating the interlayer insulating layer ILD and the gate insulating layer GI. In case that the second contact area is a drain area, the second transistor electrode TE2 may be a second drain electrode.

In an embodiment, the first transistor electrode TE1, the second transistor electrode TE2, and the gate electrode GE may include a same material. In an embodiment the first transistor electrode TE1 and the second transistor electrode TE2 may include a material illustrated as constituent materials of the gate electrode GE.

The passivation layer PSV may be disposed on the first transistor electrode TE1 and the second transistor electrodes TE2. The passivation layer PSV (for example, protection layer) may be an inorganic film (or an inorganic insulating film) including an inorganic material or an organic film (or an organic insulating film) including an organic material. The inorganic film may include, for example, at least one of a silicon nitride ($SiN_x$), a silicon oxide ($SiO_x$), a silicon oxynitride ($SiO_xN_y$), and a metal oxide such as an aluminum oxide ($AlO_x$). The organic film may include, for example, at least one of a polyacrylates resin, an epoxy resin, a phenolic resin, a polyamides resin, a polyimides rein, an unsaturated polyesters resin, a poly-phenylene ethers resin, a poly-phenylene sulfides resin, and a benzocyclobutene resin.

In embodiments, the passivation layer PSV and the interlayer insulating layer ILD may include a same material, but the disclosure is not limited thereto. The passivation layer PSV may be provided as a single layer or a multilayer of at least double layers.

The via layer VIA may be disposed on the passivation layer PSV. In an embodiment, the via layer VIA and the passivation layer PSV may include a same material. In an embodiment, the via layer VIA may include a material illustrated as constituent materials of the passivation layer PSV. In an embodiment, the via layer VIA may be an organic film made of an organic material.

The display element layer DPL may be disposed on the pixel circuit layer PCL.

The display element layer DPL may include a light emitting element LD that emits light. The first to third pixels PXL1, PXL2, and PXL3 may include the first to third light emitting elements LD1, LD2, and LD3, respectively.

The first light emitting element LD1 may include an anode AE, a first light emitting layer EML1, and a cathode CE. The second light emitting element LD2 may include an anode AE, a second light emitting layer EML2, and a cathode CE. The third light emitting element LD3 may include an anode AE, a third light emitting layer EML3, and a cathode CE. For example, the first to third light emitting elements LD1, LD2, and LD3 may be top light emitting type organic light emitting elements.

The anode electrodes AE of respective pixels PXL may be disposed in the light emitting area EMA, and may be spaced apart from each other. The anode electrode AE of each pixel PXL may be electrically connected to the first transistor electrode TE1 of the transistor T of each pixel PXL through a contact hole penetrating the via layer VIA and the passivation layer PSV A bank PDL may be disposed on the anode electrode AE. The bank PDL may define (or partition) the light emitting area EMA of each pixel PXL. The bank PDL may include an opening partially exposing the anode electrode AE of each pixel PXL.

The bank PDL may be an organic insulating layer made of an organic material. The organic material may include an acryl resin, an epoxy resin, a phenolic resin, a polyamide resin, a polyimide resin, or the like.

In embodiments, the bank PDL may include a light absorbing material, or may serve to absorb light introduced from the outside by a light absorbing agent being applied thereon. For example, the bank PDL may include a carbon-based black pigment. However, the disclosure is not necessarily limited thereto, and the bank PDL may include an opaque metallic material such as chromium (Cr), molybdenum (Mo), an alloy (MoTi) of molybdenum (Mo) and titanium (Ti), tungsten (W), vanadium (V), niobium (Nb), tantalum (Ta), manganese (Mn), cobalt (Co), or nickel (Ni), which has a high light absorbing rate.

The light emitting layer EML of each pixel PXL may be disposed on the anode electrode AE exposed by the bank PDL. The cathode electrode CE may be disposed on the light emitting layer EML. The cathode electrode CE may be entirely disposed in the first to third pixels PXL1, PXL2, and PXL3. For example, the cathode electrode CE may be provided as a common electrode, but the disclosure is not necessarily limited thereto.

The cathode electrode CE may be formed of a metal including Ag (silver), Mg (magnesium), Al (aluminum), Pt (platinum), Pd (palladium), Au (gold), Ni (nickel), Nd (neodymium), Ir (iridium), Cr (chromium), and an alloy thereof and/or a transparent conductive layer including an ITO (indium tin oxide), an IZO (indium zinc oxide), a ZnO (zinc oxide), and ITZO (indium tin zinc oxide). In embodiments, the cathode electrode CE may be formed of a multilayer of a double layer or more including a thin metal layer, for example, a triple layer of ITO/Ag/ITO.

An inorganic absorbing layer INL may be disposed on the cathode CE. The inorganic absorbing layer INL may reduce reflectance and improve transmittance to realize a highly efficient display panel PNL. For example, the inorganic absorbing layer INL may be a multi-element co-deposited film. For example, the inorganic absorbing layer INL may be formed by co-depositing bismuth (Bi) and ytterbium (Yb) on the display element layer DPL (or the cathode CE). The inorganic absorbing layer INL may be formed by reacting vaporized particles of bismuth (Bi) and ytterbium (Yb) on the display element layer DPL (or the cathode CE). In case that the inorganic absorbing layer INL is formed by co-depositing bismuth (Bi) and ytterbium (Yb), an extinction coefficient of the inorganic absorbing layer INL may be in a range of about 0.5 to about 3. A refractive index of the inorganic absorbing layer INL may be in a range of about 1 to about 3. The extinction coefficient may be a constant representing a degree of which an amount of a wave or radiation is reduced due to absorption after passing through a material, and may depend on the material. For example, the extinction coefficient may be measured by ellipsometry by using a spectrophotometer. For example, in case that polarized light is incident on a specimen, a polarization state of the reflected light may change according to characteristics of the specimen, and by measuring and analyzing the polarization state, optical characteristics including a refractive index and an extinction coefficient of the specimen may be measured.

As described above, in case that the inorganic absorbing layer INL is formed by co-depositing bismuth (Bi) and ytterbium (Yb), the extinction coefficient of the inorganic absorbing layer INL may be reduced, thereby reducing the reflectance and improving the transmittance to realize the display panel PNL with high efficiency. A detailed description of a formation process of the inorganic absorbing layer INL will be described below with reference to FIG. 9 to FIG. 12.

A thickness of the inorganic absorbing layer INL may be in a range of about 40 Å to about 200 Å in a thickness direction of the substrate SUB. For example, the thickness of the inorganic absorbing layer INL may be in a range of about 40 Å to about 100 Å, but is not necessarily limited thereto. A composition ratio (at %) of bismuth (Bi) and ytterbium (Yb) of the inorganic absorbing layer INL may be in a range of about 80:20 to about 40:60. In another embodiment, the composition ratio (at %) of bismuth (Bi) and ytterbium (Yb) of the inorganic absorbing layer INL may be in a range of about 70:30 to about 60:40, but is not necessarily limited thereto.

The inorganic absorbing layer INL, as shown in FIG. 5, may be formed in a single layer structure. In embodiments, the inorganic absorbing layer INL, as shown in FIG. 6, may be formed in multi-layer structure of two or more layers. For example, the inorganic absorbing layer may include a first inorganic absorbing layer INL1 and a second inorganic absorbing layer INL2, the first inorganic absorbing layer INL1 may be disposed on the light emitting element layer LD, and the second inorganic absorbing layer INL2 may be disposed on the first inorganic absorbing layer INL1. The second inorganic absorbing layer INL2 may be directly disposed on the first inorganic absorbing layer INL1. The second inorganic absorbing layer INL2 may be disposed between the first inorganic absorbing layer INL1 and a reflection control layer RF to be described below.

The first inorganic absorbing layer INL1 and the second inorganic absorbing layer INL2 may include a same material. For example, the first inorganic absorbing layer INL1 may be formed by co-depositing bismuth (Bi) and ytterbium (Yb). The second inorganic absorbing layer INL2 may be formed by depositing a single component such as bismuth (Bi) or ytterbium (Yb), but the disclosure is not necessarily limited thereto. In embodiments, the first inorganic absorbing layer INL1 may include at least one of titanium (Ti), zirconium (Zr), tungsten (W), tantalum (Ta), and a molybdenum oxide ($MoO_3$) as well as bismuth (Bi) and ytterbium (Yb). The second inorganic absorbing layer INL2 may include at least one of titanium (Ti), zirconium (Zr), tungsten (W), tantalum (Ta), and a molybdenum oxide ($MoO_3$) as well as bismuth (Bi) or ytterbium (Yb), but the disclosure is not necessarily limited thereto. As described above, in case that the second inorganic absorbing layer INL2 is disposed on the first inorganic absorbing layer INL1, oxidation may be effectively prevented.

The thin film encapsulation layer TFE may be disposed on the display element layer DPL. The thin film encapsulation layer TFE may have a single-layered structure or a multi-layered structure. The thin film encapsulation layer TFE may include multiple insulating layers covering the light emitting element LD. The thin film encapsulation layer TFE may include at least one inorganic film and at least one organic film. For example, the thin film encapsulation layer TFE may have a structure in which an inorganic film and an organic film are alternately stacked each other. In embodiments, the thin film encapsulation layer TFE may be an encapsulation substrate that is disposed on the light emitting element LD to be bonded to the display element layer DPL by a sealant.

A sensing layer TS may be disposed on the thin film encapsulation layer TFE. The sensing layer TS may include a first insulating layer INS1, a first sensing conductive layer MT1, a second insulating layer INS2, a second sensing conductive layer MT2, and/or a third insulating layer INS3.

The first insulating layer INS1 may include an inorganic insulating film including an inorganic material or an organic insulating film including an organic material. The inorganic insulating film may include an inorganic insulating material such as a silicon oxide ($SiO_x$), a silicon nitride ($SiN_x$), a silicon oxynitride ($SiO_xN_y$), an aluminum oxide ($Al_xO_y$), a titanium oxide ($TiO_x$), a tantalum oxide ($Ta_xO_y$), a hafnium oxide ($HfO_x$), or zinc oxide ($ZnO_x$). The organic insulating film may include at least one of an acryl-based resin, a methacrylic-based resin, polyisoprene, a vinyl-based resin, an epoxy-based resin, an urethane-based resin, a cellulose-based resin, a siloxane-based resin, a polyimide-based resin, a polyamide-based resin, and a perylene-based resin, but the disclosure is not necessarily limited thereto. In embodiments, the first insulating layer INS1 may be omitted, or may be configured as the uppermost layer of the thin film encapsulation layer TFE.

The first sensing conductive layer MT1 may be disposed on the first insulating layer INS1 or the thin film encapsulation layer TFE. The first sensing conductive layer MT1 may be partially opened so as to not overlap the light emitting element LD of each pixel PXL in a plan view. For example, the first sensing conductive layer MT1 may be disposed to overlap the non-light emitting area NEMA adjacent to the light emitting area EMA in a plan view.

The first sensing conductive layer MT1 may include a metal layer or a transparent conductive layer. For example, the metal layer may include molybdenum, titanium, copper, aluminum, the like, an alloy thereof, or a combination thereof. The transparent conductive layer may include at least one of an indium tin oxide (ITO), an indium zinc oxide (IZO), a zinc oxide (ZnO), an indium tin zinc oxide (ITZO), a PEDOT, the like, a metal nano wire, and a combination thereof, but the disclosure is not necessarily limited thereto. The first sensing conductive layer MT1 may form a connection electrode that electrically connects sensing electrodes.

The second insulating layer INS2 may be disposed on the first sensing conductive layer MT1. In an embodiment, the second insulating layer INS2 and the first insulating layer INS1 may include a same material. In an embodiment, the second insulating layer INS2 may include a material illustrated as constituent materials of the first insulating layer INS1.

The second sensing conductive layer MT2 may be disposed on the second insulating layer INS2. The second sensing conductive layer MT2 may be partially opened so as to not overlap the light emitting element LD of each pixel PXL in a plan view. For example, the second sensing conductive layer MT2 may be disposed to overlap the non-light emitting area NEMA adjacent the light emitting area EMA in a plan view.

In an embodiment, the second sensing conductive layer MT2 and the first sensing conductive layer MT1 may include a same material. In an embodiment, the second sensing conductive layer MT2 may include a material illustrated as constituent materials of the first sensing conductive layer MT1.

The second sensing conductive layer MT2 may be electrically connected to the first sensing conductive layer MT1 through a contact hole penetrating the second insulating layer INS2. The second sensing conductive layer MT2 may form a sensing electrode.

The third insulating layer INS3 may be disposed on the second sensing conductive layer MT2. The third insulating layer INS3 may include an organic film, but the disclosure is not necessarily limited thereto. In embodiments, the third insulating layer INS3 may be formed of an inorganic film, or may have a structure in which an organic film and an inorganic film are alternately stacked each other.

A light blocking layer LBP may be disposed on the display element layer DPL, the thin film encapsulation layer TFE, and/or the sensing layer TS. The light blocking layer LBP may include an opening overlapping the light emitting element LD in a plan view. For example, the light blocking layer LBP may be disposed to overlap the non-light emitting area NEMA adjacent to the light emitting area EMA in a plan view.

The light blocking layer LBP may include a light blocking material to prevent light leakage and color mixing defects. For example, the light blocking layer LBP may include a black matrix, but the disclosure is not necessarily limited thereto. In embodiments, the light blocking layer LBP may include a carbon black (CB) and/or a titanium black (TiBK).

A reflection control layer RF may be disposed on the light blocking layer LBP. The reflection control layer RF may selectively absorb light reflected from the inside of the display panel PNL according to a wavelength thereof, thereby improving visibility while preventing light efficiency of the display panel PNL from decreasing. The reflection control layer RF may improve display quality by minimizing reflection of external light.

The reflection control layer RF may include a dye, a pigment, or a combination thereof. For example, the reflection control layer RF may include an oxazine-based compound, a cyanine-based compound, a tetraazoporfin-based compound, or a squarylium-based compound, but the disclosure is not necessarily limited thereto.

A maximum absorbing wavelength of the reflection control layer RF may be in a first wavelength range in a range of about 490 nm to about 505 nm or a second wavelength range in a range of about 585 nm to about 600 nm. For example, the reflection control layer RF may absorb light having a wavelength outside of a red, green, or blue light wavelength range, thereby implementing the display panel PNL with excellent light efficiency.

Since the reflection control layer RF is provided on the display panel PNL, a separate polarizing plate and/or color filter may be omitted. Accordingly, light loss of the display panel PNL may be minimized while maintaining external light reflection performance. In case that a separate color filter is provided, a reflective color band phenomenon may occur, and in order to compensate for this, an organic layer for flattening may be additionally applied, resulting in a thicker display panel and disadvantageous characteristics in processing. The display panel PNL according to the embodiment may be provided with the reflection control layer RF to reduce the number of masks and implement a high-quality display device DD having a thin thickness.

A window WD may be provided on the reflection control layer RF. The window WD may protect a lower member from external impact and provide an input surface and/or a display surface to a user.

A manufacturing method of the display device according to the above-described embodiment will be described.

FIG. 7 to FIG. 15 illustrate schematic cross-sectional views of process steps of a manufacturing method of a display device according to an embodiment. FIGS. 16A to 16D are images illustrating an inorganic absorbing layer according to a comparative example and an example. FIG. 7 to FIG. 15 are schematic cross-sectional views illustrating a manufacturing method of the display device of FIG. 4 to FIG. 6, and are briefly shown for better understanding and ease of description, and detailed reference symbols therein are omitted.

Figure 7:
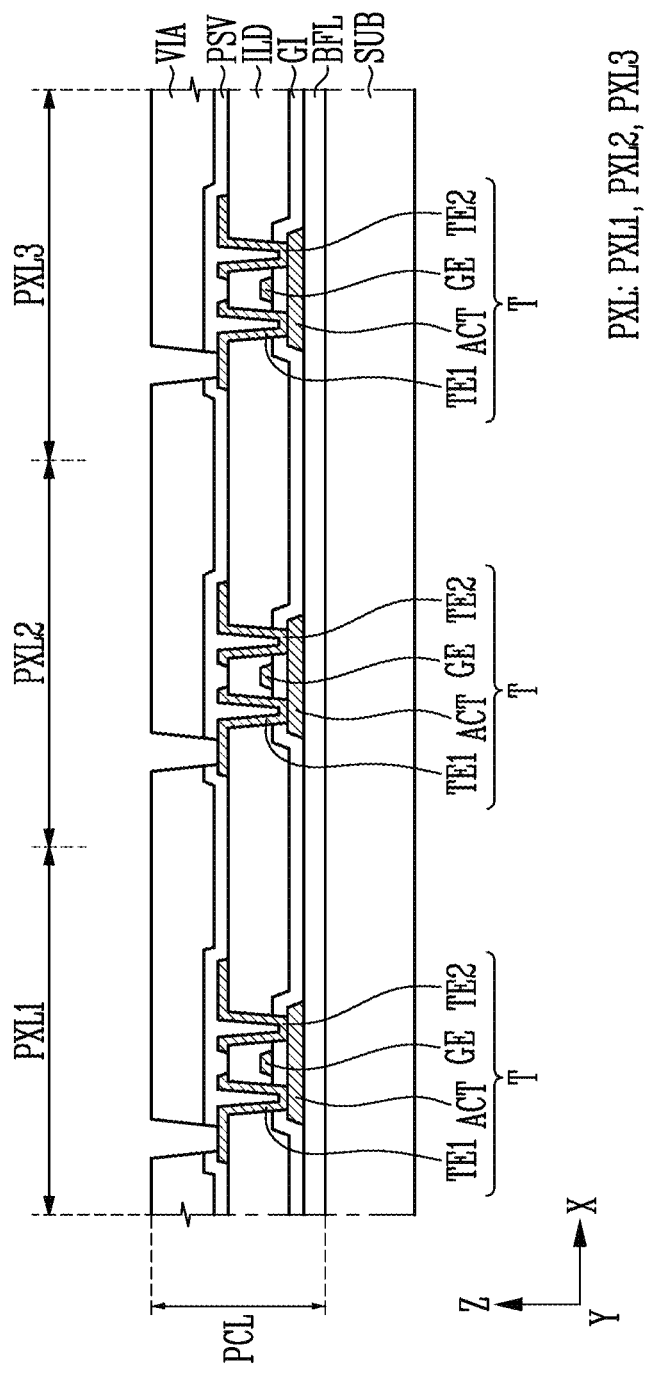
FIG. 7 to FIG. 15 illustrate schematic cross-sectional views of process steps of a manufacturing method of a display device according to an embodiment.

Referring to FIG. 7, first, the pixel circuit layer PCL may be provided on the substrate SUB. The pixel circuit layer PCL may include the transistor T and the insulating layer disposed between respective conductive layers configuring the transistor T.

Figure 8:
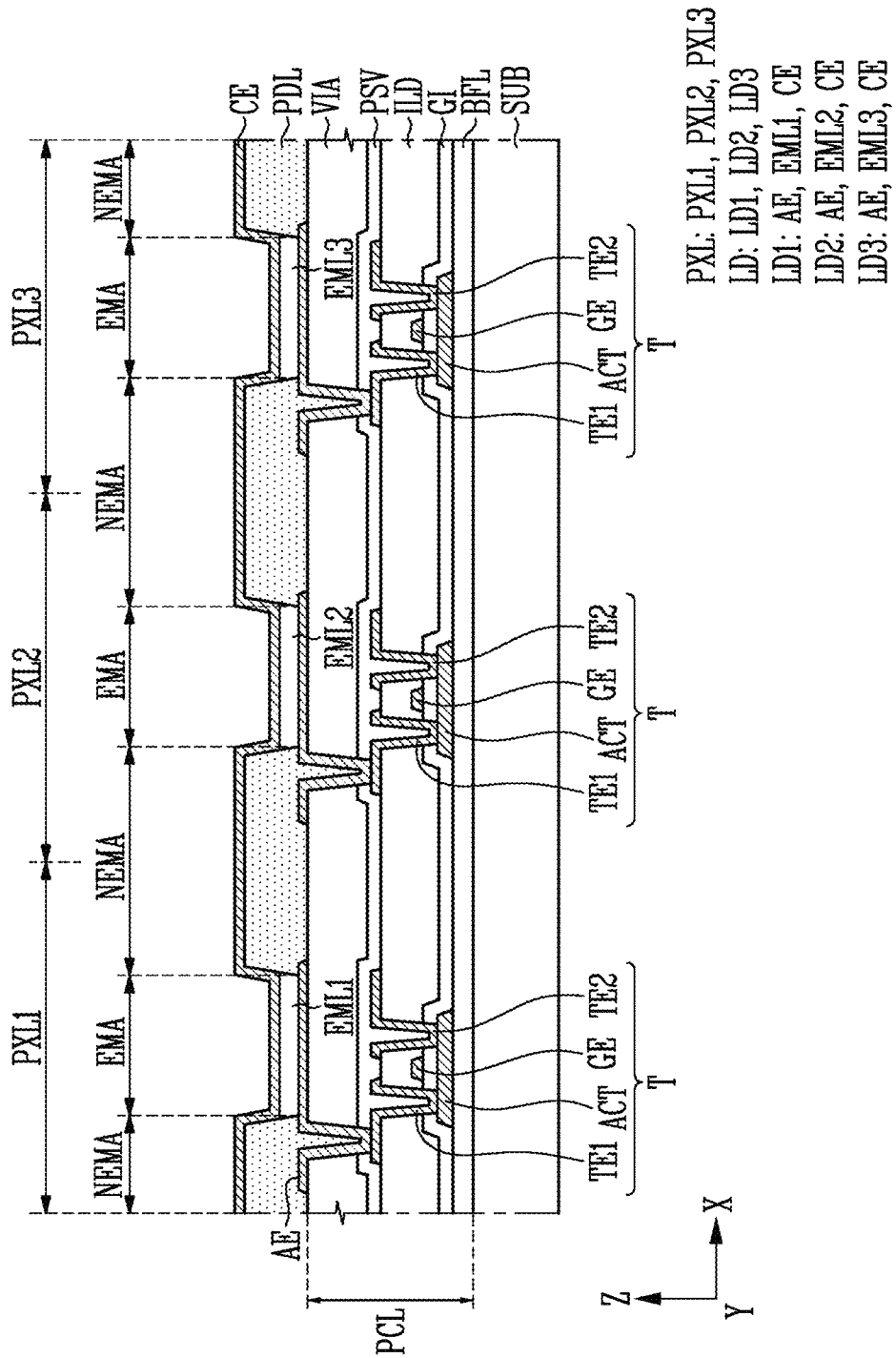

Referring to FIG. 8, the light emitting element LD may be provided on the pixel circuit layer PCL. For example, the first light emitting element LD1 may be formed in the first pixel PXL1, the second light emitting element LD2 may be formed in the second pixel PXL2, and the third light emitting element LD3 may be formed in the third pixel PXL3. The anode AE, the first light emitting layer EML1, and the cathode CE may be formed in the first pixel PXL1; the anode AE, the second light emitting layer EML2, and the cathode CE may be formed in the second pixel PXL2, and the anode AE, the third light emitting layer EML3, and the cathode CE may be formed in the third pixel PXL3

The anodes AE may be formed in each pixel PXL to be spaced apart from each other. The cathode CE may be entirely formed in the first to third pixels PXL1, PXL2, and PXL3.

Figure 9:
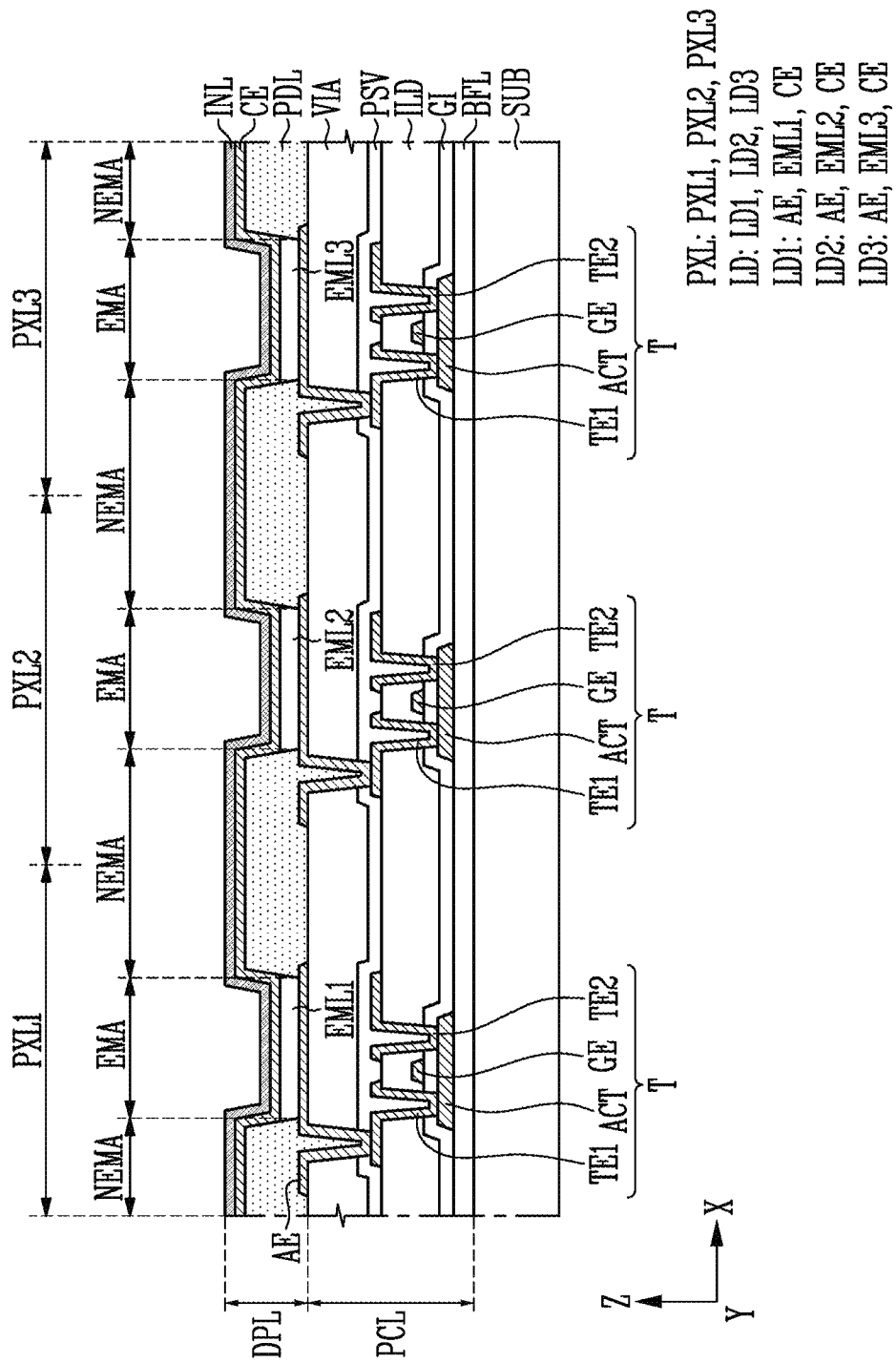

Referring to FIG. 9, the inorganic absorbing layer INL may be formed on the light emitting element LD. The inorganic absorbing layer INL may be formed by co-depositing bismuth (Bi) and ytterbium (Yb) on the display element layer DPL (or the cathode CE). For example, the inorganic absorbing layer INL may be formed by reacting vaporized particles of bismuth (Bi) and ytterbium (Yb) on the display element layer DPL (or the cathode CE). For example, a bismuth (Bi) metal compound and an ytterbium (Yb) metal compound may be simultaneously thermally deposited. In another example, a bismuth (Bi) inorganic compound and an ytterbium (Yb) inorganic compound may be simultaneously thermally deposited. As described above, as bismuth (Bi) and ytterbium (Yb) react and grow, the inorganic absorbing layer INL may be formed thin and flat, thereby minimizing oxidation to improve transmittance. A thickness of the inorganic absorbing layer INL may be in a range of about 40 Å to about 200 Å. For example, the thickness of the inorganic absorbing layer INL may be in a range of about 40 Å to about 100 Å, but the disclosure is not necessarily limited thereto.

Figure 16A:
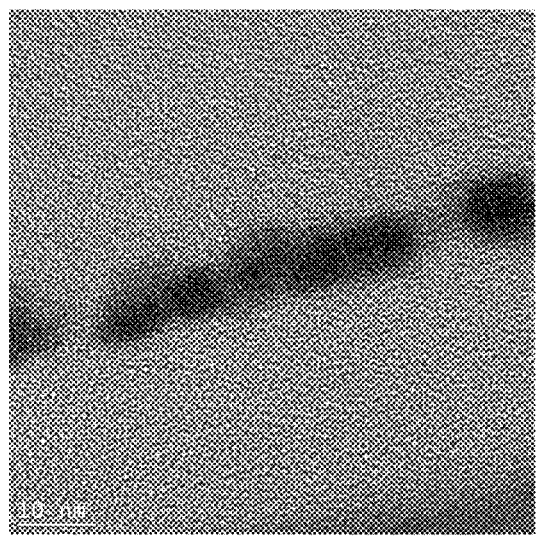
FIGS. 16A to 16D are images illustrating an inorganic absorbing layer according to a comparative example and an example.
Figure 16B:
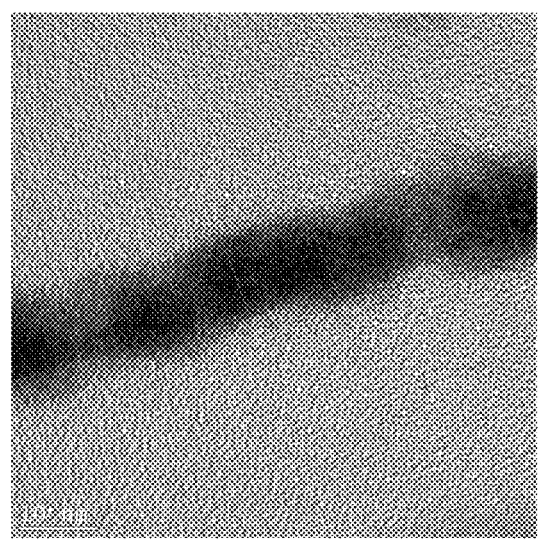
Figure 16C:
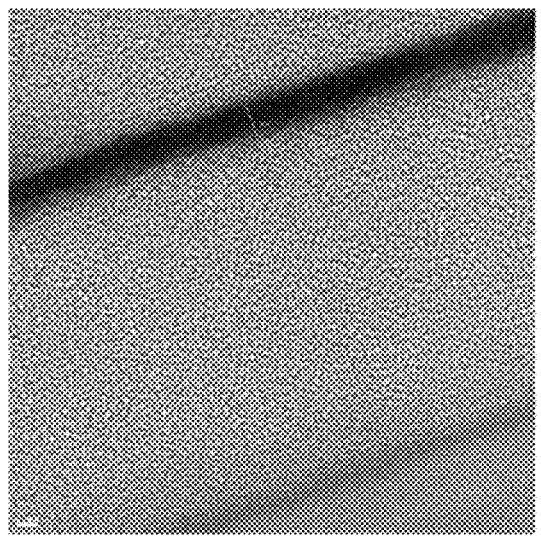
Figure 16D:
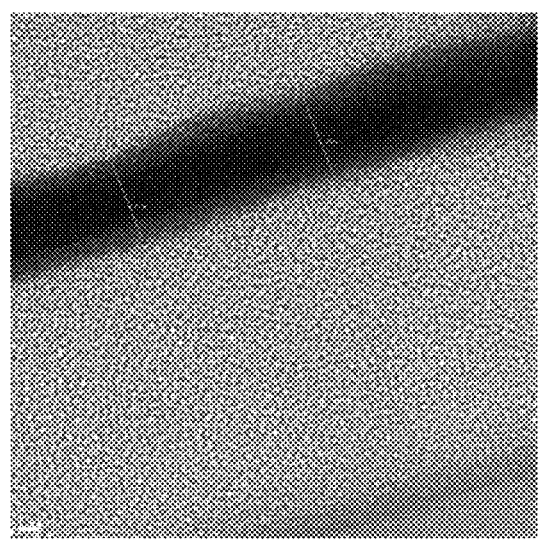

In FIGS. 16A to 16D, Comparative Example 1 (FIG. 16A) shows an inorganic absorbing layer formed with a thickness of 40 Å by depositing bismuth (Bi), Comparative Example 2 (FIG. 16B) shows an inorganic absorbing layer formed with a thickness of 100 Å by depositing bismuth (Bi), Example 1 (FIG. 16C) shows an inorganic absorbing layer formed with a thickness of 40 Å by co-depositing of bismuth (Bi) and ytterbium (Yb), and Example 2 (FIG. 16D) shows an inorganic absorbing layer formed with a thickness of 100 Å by co-depositing of bismuth (Bi) and ytterbium (Yb). Referring to FIG. 16, it can be confirmed that the inorganic absorbing layers of Example 1 (FIG. 16C) and Example 2 (FIG. 16D) may be formed with a flat and thin thickness compared to the inorganic absorbing layers of Comparative Example 1 (FIG. 16A) and Comparative Example 2 (FIG. 16B).

In the co-depositing, a deposition temperature of bismuth (Bi) may be in a range of about 500° C. to about 850° C., and a deposition temperature of ytterbium (Yb) may be in a range of about 300° C. to about 550° C. For example, the deposition temperature of bismuth (Bi) may be in a range of about 600° C. to about 700° C., and the deposition temperature of ytterbium (Yb) may be in a range of about 480° C. to about 540° C., but the disclosure is not necessarily limited thereto. A composition ratio (at %) of bismuth (Bi) and ytterbium (Yb) of the inorganic absorbing layer INL may be in a range of about 80:20 to about 40:60. In another embodiment, the composition ratio (at %) of bismuth (Bi) and ytterbium (Yb) of the inorganic absorbing layer INL may be in a range of about 70:30 to about 60:40, but the disclosure is not necessarily limited thereto. The deposition temperature and the composition ratio of the inorganic absorbing layer INL may be variously changed in consideration of optical characteristics of the inorganic absorbing layer INL, for example, a refractive index and an extinction coefficient thereof. As described above, in case that the inorganic absorbing layer INL is formed by co-depositing bismuth (Bi) and ytterbium (Yb), the extinction coefficient of the inorganic absorbing layer INL may be in a range of about 0.5 to about 3. The refractive index of the inorganic absorbing layer INL may be in a range of about 1 to about 3. As described above, since the extinction coefficient of the inorganic absorbing layer INL may be reduced, the reflectance may be reduced, and the transmittance may be improved.

Figure 10:
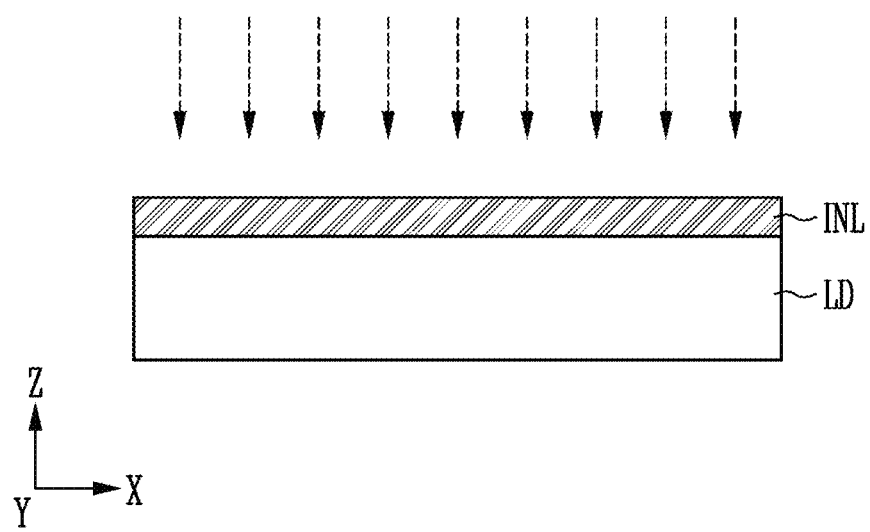
Figure 11:
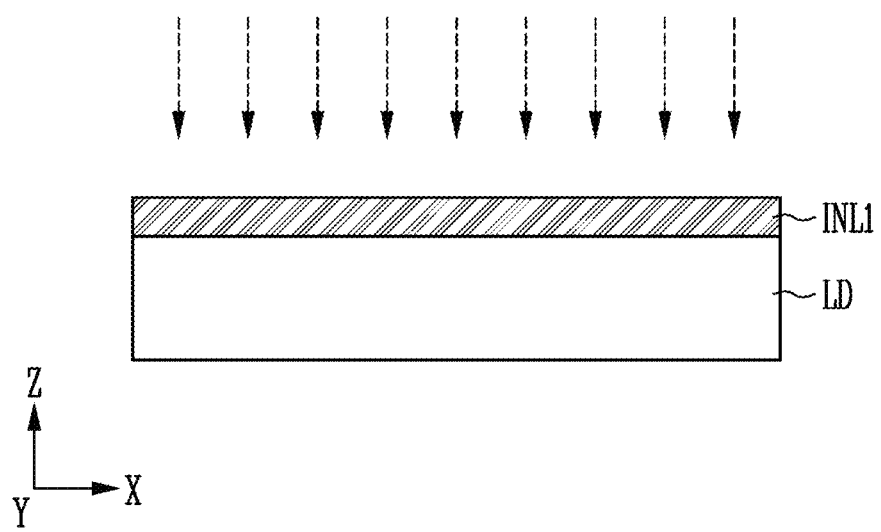
Figure 12:
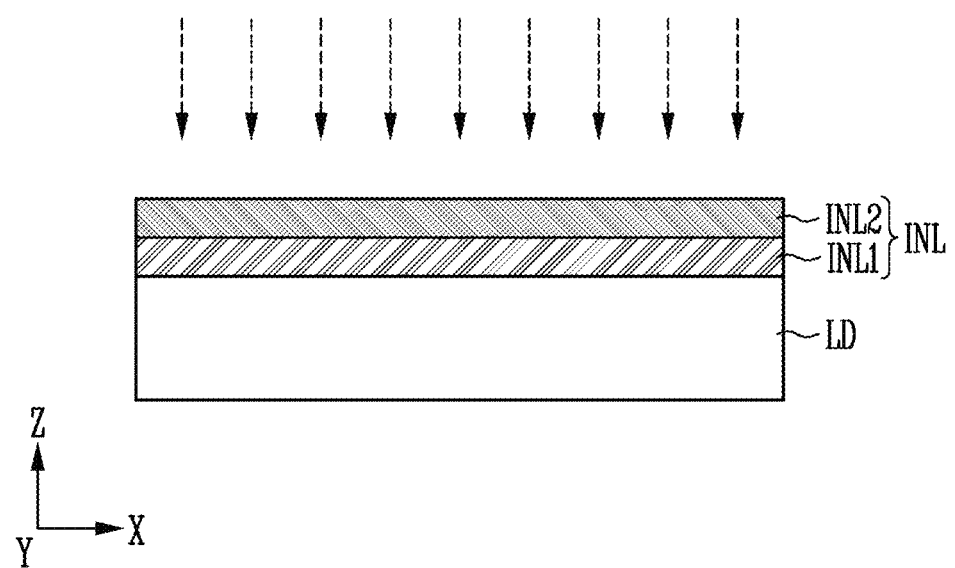

The inorganic absorbing layer INL, as shown in FIG. 10, may be formed in a single layer structure. In embodiments, as shown in FIG. 11, the first inorganic absorbing layer INL1 may be formed on the light emitting element layer LD, and as shown in FIG. 12, the second inorganic absorbing layer INL2 may be formed on the first inorganic absorbing layer INL1, so that it is possible to form the inorganic absorbing layer INL having a structure of two or more layers. The second inorganic absorbing layer INL2 may be directly formed on the first inorganic absorbing layer INL1. The first inorganic absorbing layer INL1 may be formed by co-depositing bismuth (Bi) and ytterbium (Yb). The second inorganic absorbing layer INL2 may be formed by depositing a single component such as bismuth (Bi) or ytterbium (Yb), but the disclosure is not necessarily limited thereto. In embodiments, the first inorganic absorbing layer INL1 may be formed through co-deposition using at least one of titanium (Ti), zirconium (Zr), tungsten (W), tantalum (Ta), and a molybdenum oxide ($MoO_3$) as well as bismuth (Bi) and ytterbium (Yb). The second inorganic absorbing layer INL2 may be formed using at least one of titanium (Ti), zirconium (Zr), tungsten (W), tantalum (Ta), and a molybdenum oxide ($MoO_3$) as well as bismuth (Bi) or ytterbium (Yb), but the disclosure is not necessarily limited thereto. As described above, in case that the second inorganic absorbing layer INL2 is formed on the first inorganic absorbing layer INL1, oxidation may be effectively prevented.

Figure 13:
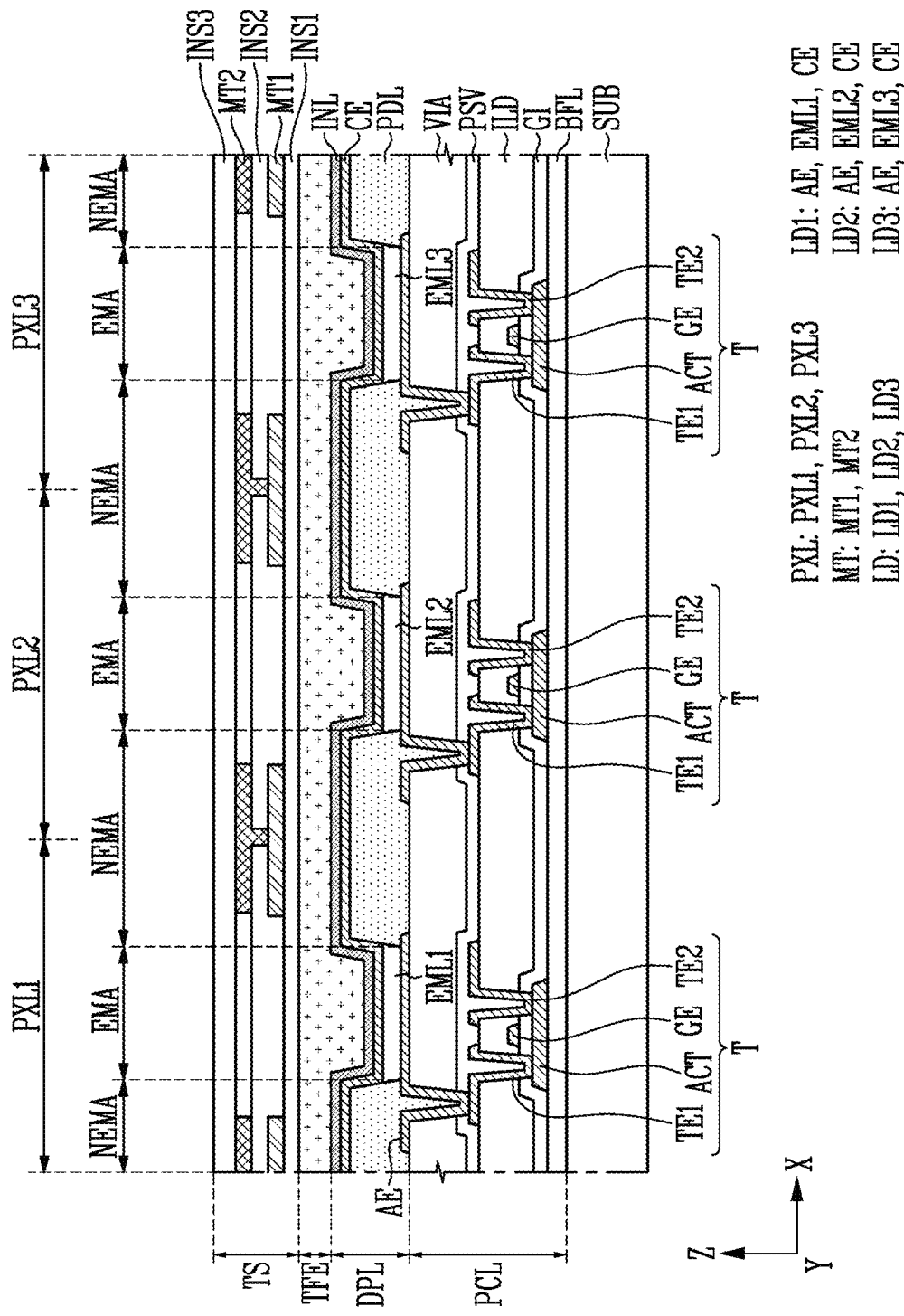

Referring to FIG. 13, the thin film encapsulation layer TFE and/or the sensing layer TS may be provided on the inorganic absorbing layer INL. The thin film encapsulation layer TFE may be formed in a single-layered structure or a multi-layered structure. The thin film encapsulation layer TFE may be formed of at least one inorganic film and at least one organic film. For example, the thin film encapsulation layer TFE may be formed by alternately stacking an inorganic film and an organic film each other. In embodiments, the thin film encapsulation layer TFE may be formed on the light emitting element LD and bonded to the display element layer DPL by a sealant.

The sensing layer TS may include the first insulating layer INS1, the first sensing conductive layer MT1, the second insulating layer INS2, the second sensing conductive layer MT2, and/or the third insulating layer INS3. The first sensing conductive layer MT1 and the second sensing conductive layer MT2 may not overlap the light emitting area EMA of each pixel PXL in a plan view. For example, the first sensing conductive layer MT1 and the second sensing conductive layer MT2 may be disposed in the non-light emitting area NEMA.

Figure 14:
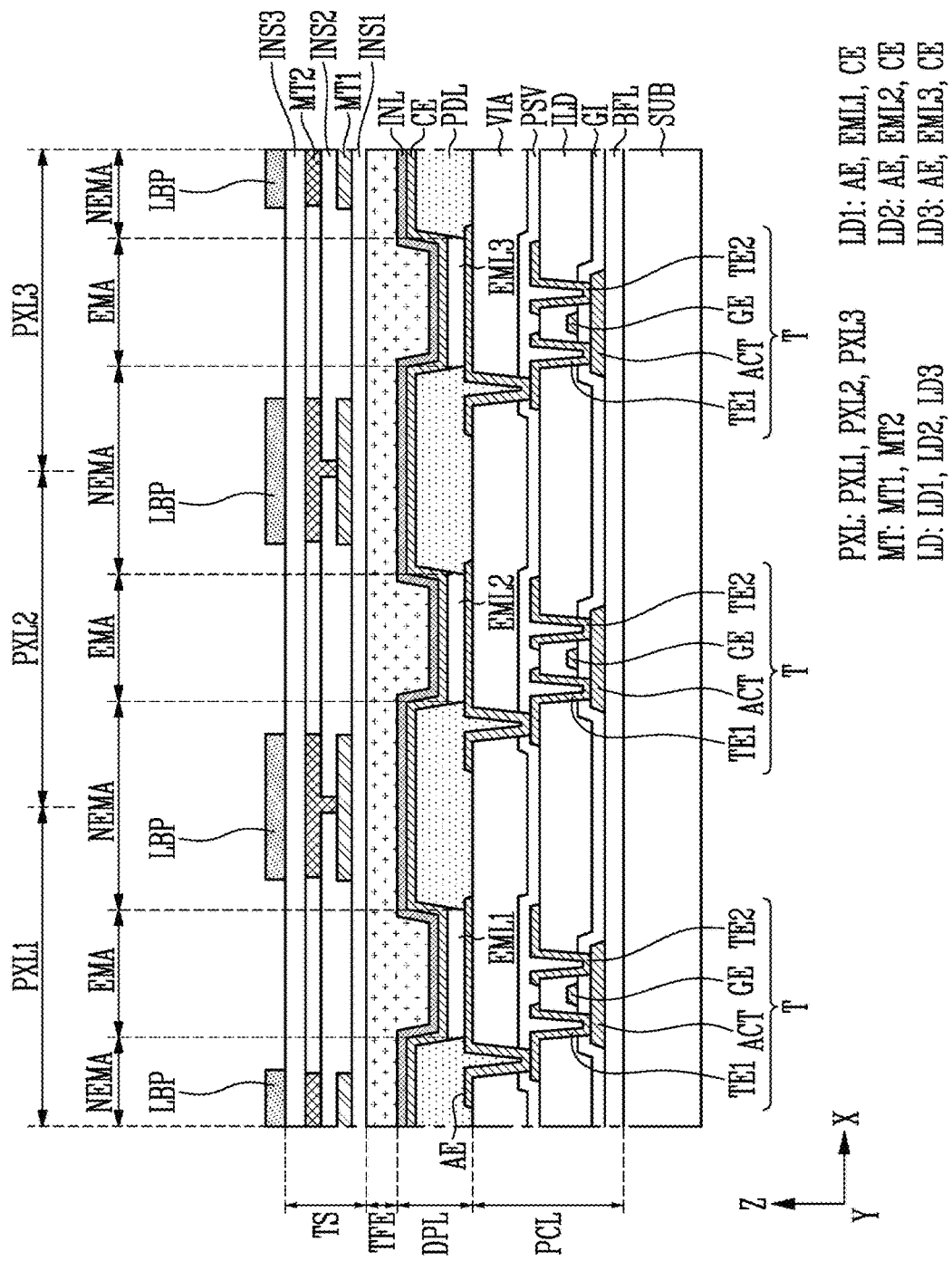

Referring to FIG. 14, the light blocking layer LBP may be formed on the thin film encapsulation layer TFE and/or the sensing layer TS. The light blocking layer LBP may be partially opened so as to not overlap the light emitting element LD of each pixel PXL in a plan view. For example, the light blocking layer LBP may not overlap the light emitting area EMA of each pixel PXL in a plan view. The light blocking layer LBP may be disposed in the non-light emitting area NEMA. The light blocking layer LBP may be made of a light blocking material to prevent light leakage and color mixing defects. For example, the light blocking layer LBP may include a black matrix, but the disclosure is not necessarily limited thereto. In embodiments, the light blocking layer LBP may include a carbon black (CB) and/or a titanium black (TiBK).

Figure 15:
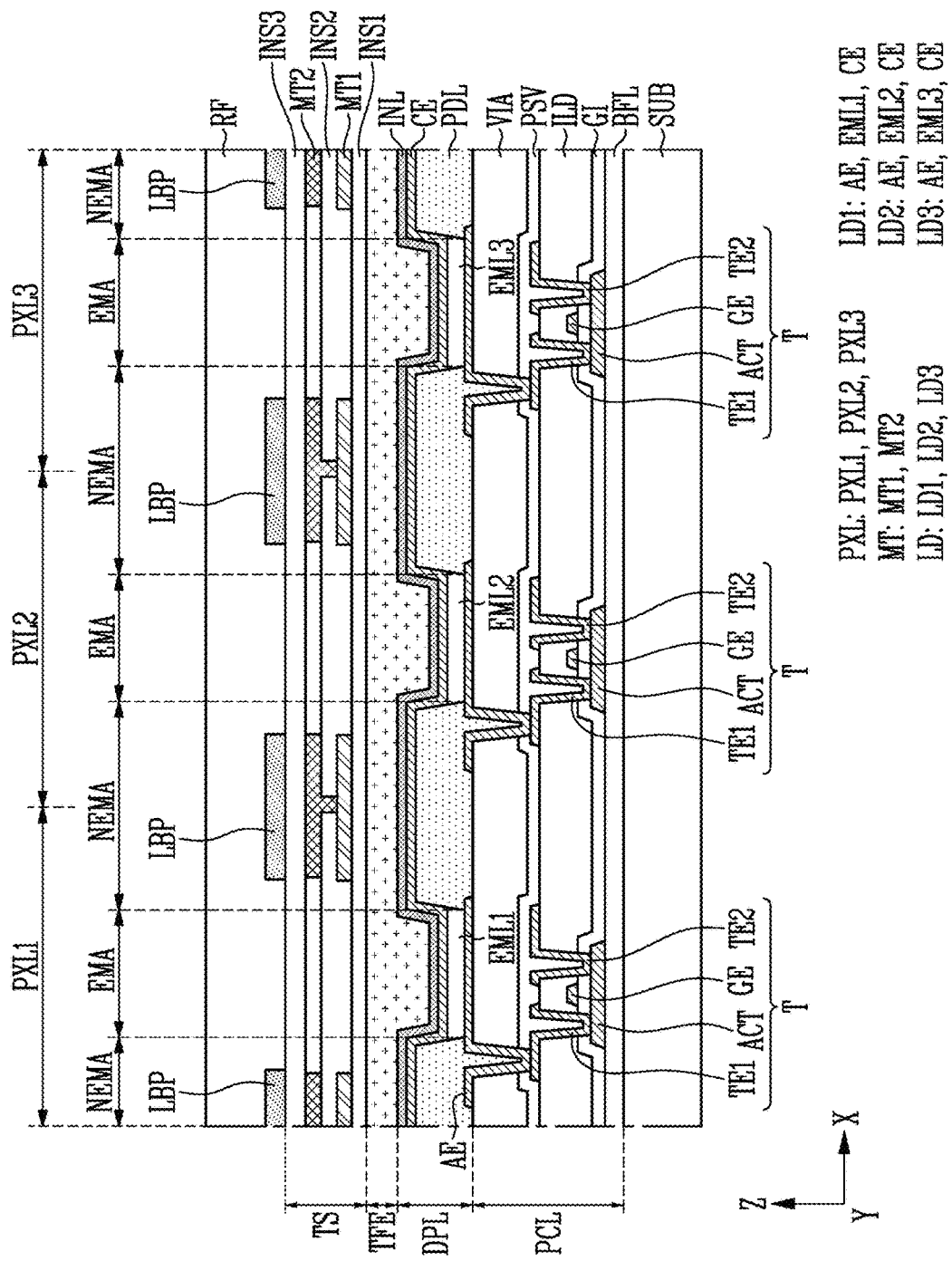

Referring to FIG. 15, the reflection control layer RF may be formed on the light blocking layer LBP. The reflection control layer RF may be made of a dye, a pigment, or a combination thereof. For example, the reflection control layer RF may be made of an oxazine-based compound, a cyanine-based compound, a tetraazoporfin-based compound, or a squarylium-based compound, but the disclosure is not necessarily limited thereto. As the reflection control layer RF is provided on the upper portion of the display panel PNL, as described above, a separate polarizing plate, a separate color filter, and/or a separate organic layer may be omitted, and light loss of the display panel PNL may be minimized and the high-quality display device DD having a thin thickness may be implemented. Subsequently, the display device of FIG. 4 may be completed by providing the window WD on the reflection control layer RF.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A manufacturing method of a display device, comprising:
   forming a light emitting element layer on a substrate;
   co-depositing bismuth (Bi) and ytterbium (Yb) on the light emitting element layer to form a first inorganic absorbing layer; and
   forming a reflection control layer on the first inorganic absorbing layer, wherein in the co-depositing,
   a deposition temperature of bismuth (Bi) is in a range of about 500° C. to about 850° C.,
   a deposition temperature of ytterbium (Yb) is in a range of about 300° C. to about 550° C., and
   an extinction coefficient of the first inorganic absorbing layer is less than or equal to about 3.

2. The manufacturing method of the display device of claim 1, wherein in the co-depositing, a bismuth (Bi) metal compound and an ytterbium (Yb) metal compound are simultaneously thermally deposited.

3. The manufacturing method of the display device of claim 1, wherein in the co-depositing, a bismuth (Bi) inorganic compound and an ytterbium (Yb) inorganic compound are simultaneously thermally deposited.

4. The manufacturing method of the display device of claim 1, wherein in the co-depositing, the deposition temperature of bismuth (Bi) is in a range of about 600° C. to about 700° C., and the deposition temperature of ytterbium (Yb) is in a range of about 480° C. to about 540° C.

5. The manufacturing method of the display device of claim 1, wherein a composition ratio of bismuth (Bi) and ytterbium (Yb) in the first inorganic absorbing layer is in a range of about 80:20 to about 40:60.

6. The manufacturing method of the display device of claim 1, wherein a refractive index of the first inorganic absorbing layer is in a range of about 1 to about 3.

7. The manufacturing method of the display device of claim 1, wherein the first inorganic absorbing layer further includes at least one of titanium (Ti), zirconium (Zr), tungsten (W), tantalum (Ta), or molybdenum oxide ($MoO_3$).

8. The manufacturing method of the display device of claim 1, further comprising:
   forming a second inorganic absorbing layer on the first inorganic absorbing layer.

9. The manufacturing method of the display device of claim 8, wherein the second inorganic absorbing layer is directly formed on the first inorganic absorbing layer.

10. The manufacturing method of the display device of claim 9, wherein the second inorganic absorbing layer includes at least one of bismuth (Bi), ytterbium (Yb), titanium (Ti), zirconium (Zr), tungsten (W), tantalum (Ta), or molybdenum oxide ($MoO_3$).

11. The manufacturing method of the display device of claim 1, further comprising:
   forming a light blocking layer on the first inorganic absorbing layer,
   wherein the reflection control layer is formed on the light blocking layer.

12. A display device comprising:
   a light emitting element layer;
   a first inorganic absorbing layer disposed on the light emitting element layer and including a multi-element co-deposited film; and
   a reflection control layer disposed on the first inorganic absorbing layer,
   wherein an extinction coefficient of the first inorganic absorbing layer is less than or equal to about 3.

13. The display device of claim 12, further comprising:
   a second inorganic absorbing layer disposed between the first inorganic absorbing layer and the reflection control layer.

14. The display device of claim 13, wherein the first inorganic absorbing layer and the second inorganic absorbing layer include a same material.

15. The display device of claim 14, wherein each of the first inorganic absorbing layer and the second inorganic absorbing layer includes at least one of bismuth (Bi), ytterbium (Yb), titanium (Ti), zirconium (Zr), tungsten (W), tantalum (Ta), or molybdenum oxide ($MoO_3$).

16. The display device of claim 15, wherein the first inorganic absorbing layer includes bismuth (Bi) and ytterbium (Yb).

17. The display device of claim 15, wherein the second inorganic absorbing layer includes bismuth (Bi) or ytterbium (Yb).

18. The display device of claim 12, wherein a composition ratio of bismuth (Bi) and ytterbium (Yb) in the first inorganic absorbing layer is in a range of about 80:20 to about 40:60.

19. The display device of claim 12, wherein a refractive index of the first inorganic absorbing layer is in a range of about 1 to about 3.

20. The display device of claim 12, further comprising:
   a light blocking layer disposed between the first inorganic absorbing layer and the reflection control layer.

* * * * *